US008933512B2

(12) United States Patent
Zhu et al.

(10) Patent No.: US 8,933,512 B2
(45) Date of Patent: Jan. 13, 2015

(54) MOSFET AND METHOD FOR MANUFACTURING THE SAME

(75) Inventors: Huilong Zhu, Poughkeepsie, NY (US); Miao Xu, Beijing (CN); Qingqing Liang, Lagrangeville, NY (US)

(73) Assignee: Institute of Microelectronics, Chinese Academy of Science, Beijing (CN)

( * ) Notice: Subject to any disclaimer, the term of this patent is extended or adjusted under 35 U.S.C. 154(b) by 403 days.

(21) Appl. No.: 13/208,964

(22) Filed: Aug. 12, 2011

(65) Prior Publication Data

US 2012/0139044 A1 Jun. 7, 2012

Related U.S. Application Data

(63) Continuation-in-part of application No. PCT/CN2011/071512, filed on Mar. 4, 2011.

(30) Foreign Application Priority Data

Dec. 3, 2010 (CN) .......................... 2010 1 0573204

(51) Int. Cl.
*H01L 21/336* (2006.01)
*H01L 29/772* (2006.01)
*H01L 29/786* (2006.01)

(52) U.S. Cl.
CPC ................................ *H01L 29/78648* (2013.01)
USPC ................... 257/347; 257/348; 257/E21.409; 257/E29.242

(58) Field of Classification Search
CPC ..................... H01L 21/2652; H01L 29/66742; H01L 29/66772; H01L 29/78648; H01L 29/66545; H01L 21/336; H01L 29/772; H01L 29/2652; H01L 29/4908; H01L 29/42384
See application file for complete search history.

(56) References Cited

U.S. PATENT DOCUMENTS 6,084,268 A * 7/2000 de Fresart et al. ............ 257/342
6,391,695 B1 * 5/2002 Yu ................................ 438/166

(Continued)

FOREIGN PATENT DOCUMENTS

CN 1252833 C 4/2004
CN 1487597 A 4/2004

(Continued)

OTHER PUBLICATIONS

Yan, Ran-Hong, et at., "Scaling the Si MOSFET: From Bulk to SOI to Bulk"; IEEE Transactions on Electron Devices, vol. 39, No. 7, Jul. 1992; pp. 1704-1710.

(Continued)

*Primary Examiner* — Minh-Loan Tran
*Assistant Examiner* — Fazli Erdem
(74) *Attorney, Agent, or Firm* — Osha Liang LLP

(57) ABSTRACT

The present application discloses a MOSFET and a method for manufacturing the same. The MOSFET comprises an SOI wafer, which comprises a bottom semiconductor substrate, a first buried insulating layer on the bottom semiconductor substrate, and a first semiconductor layer on the first buried insulating layer; a source region and a drain region which are formed in a second semiconductor layer over the SOI wafer, wherein there is a second buried insulating layer between the second semiconductor layer and the SOI wafer; a channel region, which is formed in the second semiconductor layer and located between the source region and the drain regions; and a gate stack, which comprises a gate dielectric layer on the second semiconductor layer and a gate conductor on the gate dielectric layer, wherein the MOSFET further comprises a backgate formed in a portion of the first semiconductor substrate below the channel region, the backgate having a non-uniform doping profile, and the second buried insulating layer serving as a gate dielectric layer of the backgate. The MOSFET has an adjustable threshold voltage by changing the polarity of dopants and/or the doping profile in the back-gate. Leakage in the semiconductor device can be reduced.

8 Claims, 3 Drawing Sheets

16
15
14 13 14
12
17 11 17
102
101
doping concentration
distance
distance
doping concentration

(56) References Cited

U.S. PATENT DOCUMENTS

| | | | | |
|---|---|---|---|---|
| 6,441,436 | B1 * | 8/2002 | Wu et al. | 257/350 |
| 6,664,598 | B1 | 12/2003 | Dennard et al. | |
| 2002/0063285 | A1 * | 5/2002 | Wu et al. | 257/347 |
| 2002/0063286 | A1 | 5/2002 | Wu et al. | |
| 2004/0121549 | A1 | 6/2004 | Dokumaci et al. | |
| 2007/0048925 | A1 | 3/2007 | McStay et al. | |
| 2008/0211023 | A1 * | 9/2008 | Shino | 257/347 |

FOREIGN PATENT DOCUMENTS

| | | | |
|---|---|---|---|
| CN | 1282233 | C | 8/2004 |
| CN | 1523649 | A | 8/2004 |
| CN | 1921075 | A | 2/2007 |
| CN | 100459076 | C | 2/2007 |
| CN | 101118924 | A | 2/2008 |

OTHER PUBLICATIONS

International Search Report and Written Opinion issued Aug. 18, 2011, by the China Patent Office in related Chinese Patent Application No. CN PCT/CN2011/071512 (no English translation) (9 pages).

First Office Action dated Dec. 16, 2013, issued by the China Patent Office in related Chinese Patent Application No. 201010573204.6, with English translation) (13 pages).

Second Official Action dated Jun. 11, 2014, issued by The State Intellecutual Property Office of the People's Republic of China in corresponding Chinese Patent Application No. CN 2010-10573204.6, with an English translation. (10 pages).

* cited by examiner

MOSFET AND METHOD FOR MANUFACTURING THE SAME

CROSS-REFERENCE APPLICATIONS

This application claims priority to PCT Application No. PCT/CN2011/071512, filed on Mar. 4, 2011, entitled "MOSFET and Method for Manufacturing the Same", which claimed priority to Chinese Application No. 201010573204.6, filed on Dec. 3, 2010. Both the PCT application and Chinese application are incorporated herein by reference in their entireties.

FIELD OF INVENTION

The present invention relates to a MOSFET and a method for manufacturing the same, and more particularly, to a MOSFET having a backgate and a method for manufacturing the same.

BACKGROUND OF THE INVENTION

One important trend of integrated circuit technology is the scaling down of metal-oxide-semiconductor field effect transistors (MOSFETs) for a higher integration degree of devices and reduction of manufacturing costs. However, it is well known that the reduction of MOSFET sizes will incur short channel effects. As the sizes of a MOSFET are scaling down, the gate of the MOSFET has a smaller effective length, and the proportion of charges in the depletion region which is actually controlled by the gate voltage becomes smaller. Consequently, the MOSFET has a reduced threshold voltage with a reduced channel length.

In a MOSFET, it is desirable to increase the threshold voltage of the device so as to suppress short channel effects. On the other hand, it may also be desirable to reduce the threshold voltage of the device so as to lower the power consumption, for example, in an application with low voltage supply, or in an application using both P-type and N-type MOSFETs.

Channel doping is a known approach for tuning the threshold voltage. However, when the threshold voltage of a device is increased by increasing the doping concentration in the channel region, carrier mobility decreases, and device performances deteriorate. Moreover, the highly-doped ions in the channel region may compensate the ions in the region where source/drain region meets the channel region, which decreases the doping concentration in said region and increases the device resistance.

It is disclosed in "Scaling the Si MOSFET: From bulk to SOI to bulk", IEEE Trans. Elect. Dev., Vol. 39, p. 1704, June, 1992 by Yan et al. that a ground plane, i.e. a backgate being grounded, may be provided under the buried oxide layer for suppressing the short channel effects in an SOI MOSFET.

However, the SOI MOSFET with a grounded backgate mentioned above is still not able to meet the requirement for threshold voltage while the channel length of the semiconductor device continues to shrink.

Therefore, it is still desirable that the threshold voltage of the semiconductor device can be adjusted in a controllable manner without increasing the doping concentration in the channel or deteriorating the performances of the semiconductor device.

SUMMARY OF THE INVENTION

One object of the present invention is to provide a MOSFET, the threshold voltage of which is adjustable by using a backgate.

According to one aspect of the present invention, there is provided a MOSFET, comprising: an SOI wafer, which comprises a bottom semiconductor substrate, a first buried insulating layer on the bottom semiconductor substrate, and a first semiconductor layer on the first buried insulating layer; a source region and a drain region, which are formed in a second semiconductor layer over the SOI wafer, wherein there is a second buried insulating layer between the second semiconductor layer and the SOI wafer; a channel region, which is formed in the second semiconductor layer and located between the source region and the drain regions; and a gate stack, which comprises a gate dielectric layer on the second semiconductor layer and a gate conductor on the gate dielectric layer, wherein the MOSFET further comprises a backgate formed in a portion of the first semiconductor substrate below the channel region, the backgate having a non-uniform doping profile and the second buried insulating layer serving as a gate dielectric layer of the backgate.

In one embodiment of the MOSFET, the first buried insulating layer and the second buried insulating layer may be preferably each a buried oxide layer.

According to another aspect of the present invention, there is provided a method for manufacturing a MOSFET, comprising: a) providing an SOI wafer, which comprises a bottom semiconductor substrate, a first buried insulating layer on the bottom semiconductor substrate, and a first semiconductor layer on the first buried insulating layer; b) forming a second buried insulating layer on the SOI wafer and forming a second semiconductor layer on the second buried insulating layer; c) forming a gate stack on the second semiconductor layer, the gate stack comprising a gate dielectric layer and a gate conductor on the gate dielectric layer; d) performing an ion implantation for a backgate to the first semiconductor layer to form an ion implanted region; e) performing annealing after the ion implantation, so that the ion implanted region extends laterally to form the backgate in a portion of the first semiconductor layer below the gate conductor, wherein the backgate has a non-uniform doping profile; and f) performing a source/drain ion implantation to the second semiconductor layer to form a source region and a drain region. In one embodiment of the method, the first buried insulating layer and the second buried insulating layer may be preferably each a buried oxide layer.

In the MOSFET according to the present invention, a backgate is formed in the first semiconductor layer, and the second buried insulating layer serves as a gate dielectric layer of the backgate. When a control voltage is applied to the backgate, the resultant control electrical field will be applied to the channel region through the second buried insulating layer. Due to the non-uniform doping profile in the backgate, the threshold voltage can be adjusted according to practical needs by changing the polarity of dopants and/or the doping profile in the backgate.

DETAILED DESCRIPTION OF EMBODIMENTS

Figure 1:
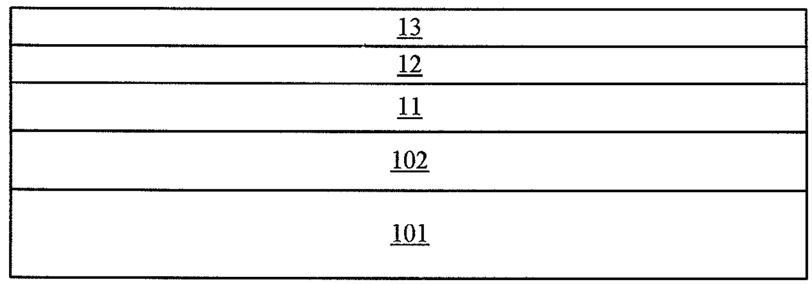
FIGS. 1-6 schematically show cross-sectional views of semiconductor structures at various stages of the method for manufacturing an ultra-thin MOSFET according to the present invention.

Exemplary embodiments of the present invention are described in detail below with reference to the accompanying drawings. In the drawings, like reference numerals denote like components. The figures are not drawn to scale for the sake of clarity.

Some particular details of the invention will be described, such as exemplary structures, materials, dimensions, process steps and fabricating methods of a semiconductor device, for a better understanding of the present invention. Nevertheless, it is understood by one skilled person in the art that these details are not always necessary, but can be varied in specific implementation of the invention. Unless the context clearly indicates otherwise, each part of the semiconductor device can be made of any material(s) well-known to one skilled person in the art.

According to one preferred embodiment of the present invention, the steps shown in FIGS. 1 to 6 are performed in sequence for manufacturing an ultra-thin SOI MOSFET.

As shown in FIG. 1, a typical SOI wafer as an initial structure of the semiconductor substrate is provided, and the SOI wafer comprising a bottom semiconductor substrate 101, a first buried oxide layer 102, and a first semiconductor layer 11 from bottom to top. The first semiconductor layer 11 has a thickness of about 10-100 nm, and the first buried oxide layer 102 has a thickness of about 20-200 nm. The first semiconductor layer 11 will be used for providing a backgate for the MOSFET. Alternatively, the first buried oxide layer 102 may be replaced by other buried insulating layers.

The process for providing an SOI wafer is known in the art. For example, the SmartCut™ process (referred as "Smart Cut" or "Smart Strip") may be used for this purpose. The SmartCut™ process comprises the steps of: bonding two wafers with each other, wherein each of the wafers has a surface oxide layer formed by thermal oxidation or deposition, and one of the wafers has been subjected to hydrogen implantation so as to form a hydrogen implanted region at a predetermined depth in the silicon body below the surface oxide layer; and then converting the hydrogen implanted region into a layer of bubbles under the conditions of increased pressure and increased temperature, so as to separate the layers. As a result, the other one of the two wafers forms an SOI wafer. By controlling process parameters in the thermal oxidation or deposition, the thickness of the buried oxide layer in the SOI wafer can be controlled. By controlling implantation energy of hydrogen, the thickness of the top semiconductor layer in the SOI wafer can be controlled.

As the first step of the method according to the present invention, the foregoing process for forming the SOI wafer, such as the SmartCut™ process, may be performed again to form a second buried oxide layer 12 having a thickness of about 5-30 nm and a second semiconductor layer 13 having a thickness of about 5-20 nm on top of the SOI wafer. Alternatively, the second buried oxide layer 12 may be replaced by other buried insulating layers. The first semiconductor layer 11 (referred as "SOI semiconductor layer" hereinafter) in the SOI wafer and the second semiconductor layer 13 in the SOI wafer may be made of the same of different semiconductor materials, such as a semiconductor material selected from a group consisting of group IV semiconductors (such as silicon or germanium) and group III-V compound semiconductors (such as gallium arsenide). Preferably, the first semiconductor layer 11 is made of single-crystalline silicon, polysilicon, or SiGe. Preferably, the first semiconductor layer 11 is made of SiGe. The second semiconductor layer 13 may be made of Si. The second semiconductor layer 13 will be used for providing a source region and a drain region and a channel region of the MOSFET.

Figure 2:
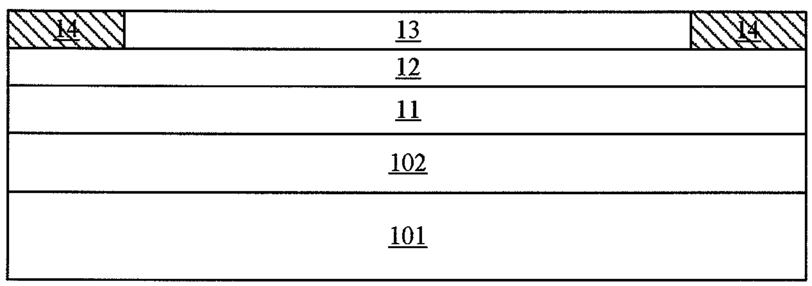

Trenches is formed by patterning the second semiconductor layer 13. An insulating material fills the trenches so as to form shallow trench isolations (STIs) 14 for defining active regions of the MOSFET, as shown in FIG. 2.

The patterning process may involve the following steps: forming a photoresist mask having patterns on the second semiconductor layer 13 by a conventional lithographical process including exposure and development; removing the exposed portions of the second semiconductor layer 13 by dry etching such as ion beam milling, plasma etching, reactive ion etching, laser ablation, and the like, or by wet etching using an etchant, wherein the etching stops at the top of the second buried oxide layer 12; and removing the photoresist mask by ashing or dissolution with a solvent.

Figure 3:
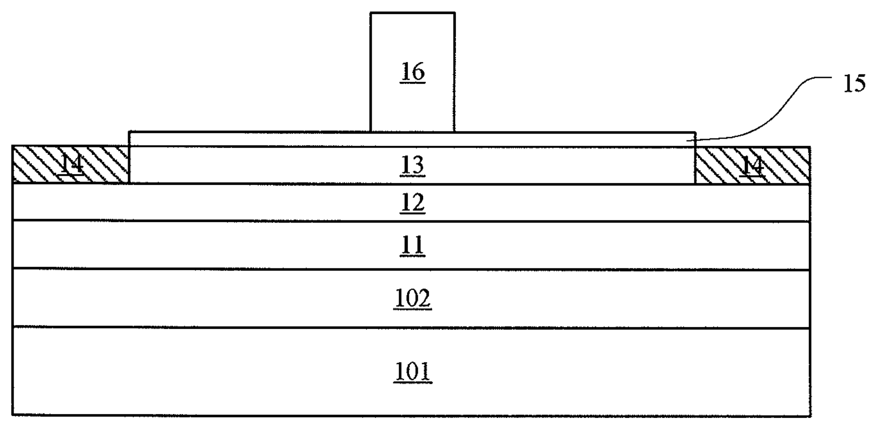

A gate stack is then formed on the second semiconductor layer 13, as shown in FIG. 3. The gate stack comprises a gate dielectric layer 15 having a thickness of about 1-4 nm and a gate conductor 16 having a thickness of about 30-100 nm. The deposition process and patterning processes for forming the gate stack is known in the art. The gate conductor 16 is typically patterned into stripes.

The gate dielectric layer 15 is made of one or more of oxides, oxynitrides, and high-K materials. The gate conductor 16 may be, for example, a metal layer, a doped polysilicon layer, or a stacked gate conductor including a metal layer and a doped polysilicon layer.

The channel region comprises a portion (not shown) of the second semiconductor layer 13 below the gate stack, and is preferably undoped, or self-doped, or doped in a previous separated ion implantation.

Figure 4:
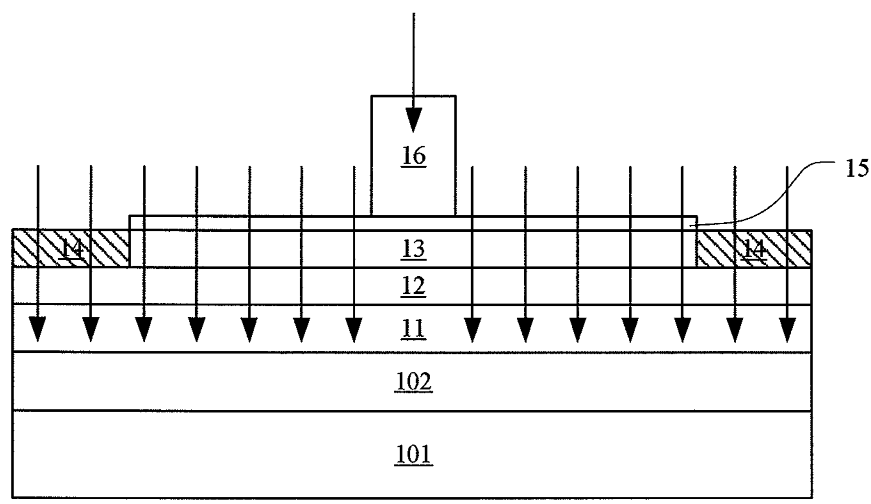

An ion implantation is then performed to the first semiconductor substrate 11 through the gate dielectric layer 15, the second semiconductor layer 13, and the second buried oxide layer 12, as shown in FIG. 4. Since the total thickness of the gate dielectric layer 15, the second semiconductor layer 13, and the second buried oxide layer 12 is only about 10-50 nm, the implanted ions will easily penetrate these layers and enter into the first semiconductor substrate 11. The implantation depth can be controlled by adjusting implantation energy, so that the implanted ions can mainly located in the first semiconductor substrate 11.

When the first semiconductor layer 11 has a relatively small thickness, the ion implanted region can spread across the whole thickness of the first semiconductor layer 11 (not shown). The first buried oxide layer 102 below the first semiconductor layer 11 prevents dopants from entering into the bottom semiconductor substrate 101.

Alternatively, when the first semiconductor layer 11 has a relatively large thickness, the ion implanted region will locate only in the upper portion of the first semiconductor substrate 11 and have a certain distance from the overlying second buried oxide layer 12, without directly adjoining the second buried oxide layer 12 (not shown).

The doping profile in the ion implantation process may be determined by the angle of ion implantation. If the ion implantation for the backgate is performed in a direction perpendicular to the main surface of the SOI wafer, a non-implanted region will be formed in the portion of the first semiconductor layer below the gate conductor, and implanted regions will be formed in other portions of the first semiconductor layer (see FIG. 4). If the ion implantation for the backgate is performed at an oblique angle, an implanted region having a first doping concentration will be formed in the portion of the first semiconductor layer below the gate conductor, and implanted regions having a second doping concentration will be formed in other portions of the first semiconductor layer (not shown), the first doping concentration being higher than the second doping concentration.

The polarity of dopants and the doping profile in the ion implantation process depend on the polarity of the MOSFET and the target value of the threshold voltage. In order to increase the threshold voltage of the device, the doping profile shown in FIG. 4 may be used. For an N-type MOSFET, P-type dopants may be used, such as boron (B or $BF_2$), indium (In), or their combinations; and for a P-type MOSFET, N-type dopants may be used, such as arsenic (As), phosphorus (P), or their combinations. In order to decrease the threshold voltage, the doping profile opposite to that shown in FIG. 4 may be used, namely, a portion of the first semiconductor layer below the gate conductor has a doping concentration higher than that of other portions of the first semiconductor layer. For an N-type MOSFET, N-type dopants may be used, such as arsenic (As), phosphorus (P), or their combinations; and for a P-type MOSFET, P-type dopants may be used, such as boron (B or $BF_2$), indium (In), or their combinations.

The doping dose may be determined according to the thickness of the layer, which is, for example, about 1 $e^{15}$-1 $e^{20}/cm^3$.

Then, a short-time annealing, which is known as spike annealing, is performed after the ion implantation by using such as laser, electron beam, or infrared radiation, and so on, so as to repair damages in the lattice and activate the implanted dopants. The annealing after the ion implantation may lead to another diffusion of the implanted dopants and provides a doping profile extending laterally into the non-implanted region below the gate conductor 16 so as to form a doped backgate 17 in the first semiconductor layer 11.

Due to the lateral diffusion of the dopants, the doping concentration of the backgate 17 below the channel region decreases gradually towards the center of the channel region and decreases to zero in the vicinity of the center of the channel region, such that the backgate 17 contains two discontinuous potions which are adjacent to the source region and the drain region, respectively (see FIG. 5, which shows the curve of the doping profile in the backgate).

Alternatively, if the annealing after the ion implantation lasts for a sufficiently long time, the two portions of the backgate may connect with each other due to the lateral diffusion of the dopants. Because of the lateral diffusion of the dopants, the doping concentration of the backgate 17 below the channel region also decreases gradually towards the center of the channel region and reaches a minimum value (but greater than zero) at the center of the channel region.

Figure 5:
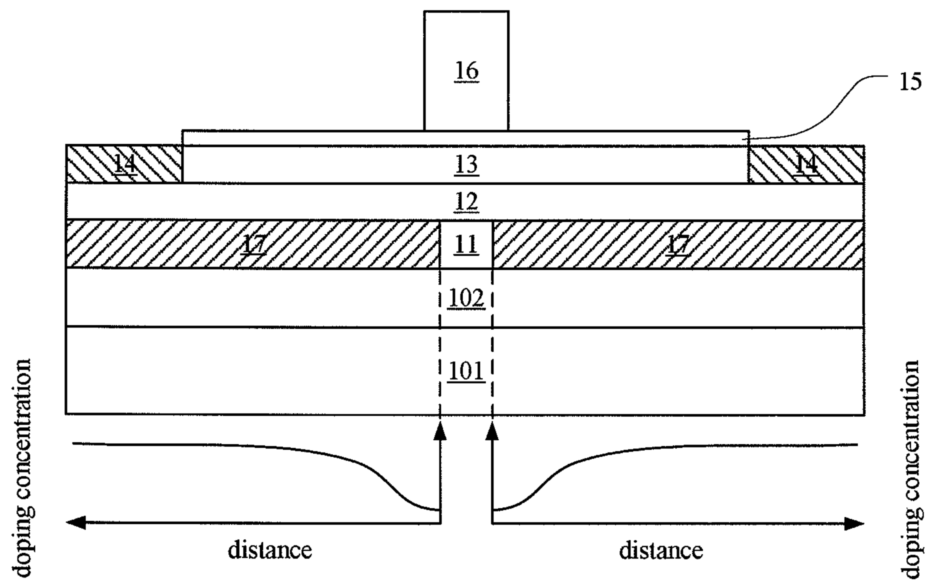

As mentioned above, if the ion implantation for the backgate is performed at an oblique angle, the doping profile of dopants would be opposite to that shown in FIG. 5. Due to lateral diffusion of dopants, the doping concentration of the backgate 17 below the channel region increases gradually towards the center of the channel region (not shown).

However, annealing after ion implantation at an excessively high temperature and/or lasting for an excessively long time is not desirable, because the non-uniform doping profile may be completely eliminated and resulting in a uniform doping concentration everywhere below the channel region.

Figure 6:
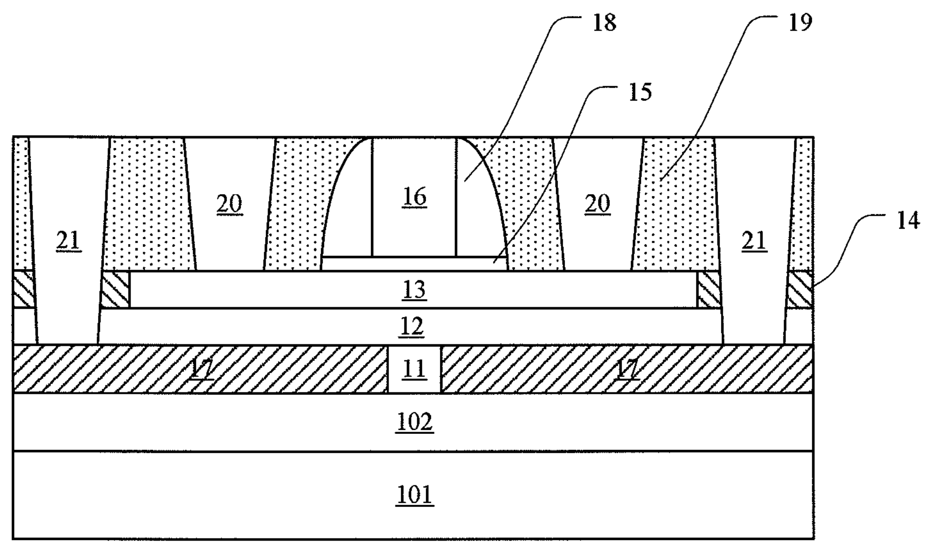

A standard CMOS process may then be performed, comprising the following steps: implanting ions in the second semiconductor layer 13 for forming a source region and a drain region (not shown); forming sidewall spacers 18 surrounding the gate conductor; forming an interlayer dielectric layer 19 on the semiconductor structure; forming electrically conductive vias 20 which are electrically connected to the source region and the drain regions, respectively, through the interlayer dielectric layer 19; and forming two electrically conductive vias 21 which are electrically connected to the two portions of the backgate 17, respectively, through the interlayer dielectric layer 19, the shallow trench isolation 14, and the second buried oxide layer 12. The resultant device structure of the whole SOI MOSFET is shown in FIG. 6.

In the SOI MOSFET according to the present invention, the first semiconductor layer serves as a conductor layer of the backgate, and the second buried oxide layer serves as a gate dielectric layer of the backgate. When applying a control voltage to the backgate, the resultant controlling electrical field is applied to the channel region through the second buried oxide layer. Due to the non-uniform doping profile in the backgate, the threshold voltage can be adjusted in accordance with the length of the channel region. For example, the threshold voltage of the device may possibly be lower with a shorter channel region. In this case, the threshold voltage can be increased by implanting ions into the backgate so that the dopant polarity of the backgate is opposite to the polarity of the SOI MOSFET. On the contrary, if the threshold voltage of the device is too large, the threshold voltage can be decreased by implanting ions into the backgate so that the dopant polarity of the backgate is the same as the polarity of the SOI MOSFET.

In one embodiment of the present application, a doped backgate is formed, and the channel region is preferably undoped. Accordingly, the formation of a p-n junction between the channel region and the source/drain region can be avoided, and leakage in the device can be reduced.

Although the invention has been described with reference to specific embodiments, the description is only illustrative of the invention. The description is not construed as limiting the invention. Various modifications and applications may occur for those skilled in the art without departing from the spirit and scope of the invention as defined by the appended claims.

What is claimed is:

1. A MOSFET, comprising:

an SOI wafer, which comprises a bottom semiconductor substrate, a first buried insulating layer on the bottom semiconductor substrate, and a first semiconductor layer on the first buried insulating layer;

a source region and a drain region, which are formed in a second semiconductor layer over the SOI wafer, wherein there is a second buried insulating layer between the second semiconductor layer and the SOI wafer;

a channel region, which is formed in the second semiconductor layer and located between the source region and the drain regions; and a gate stack, which comprises a gate dielectric layer on the second semiconductor layer and a gate conductor on the gate dielectric layer, wherein the MOSFET further comprises a backgate formed in a portion of the first semiconductor substrate below the channel region, the backgate having a non-uniform doping profile in a lateral direction from the source region to the drain region or vice versa so that in the lateral direction a doping concentration of the backgate increases gradually towards the center of the channel region, and the second buried insulating layer serving as a gate dielectric layer of the backgate.

2. The MOSFET according to any of claim 1, wherein the dopant polarity of the backgate is opposite to the polarity of the MOSFET.

3. The MOSFET according to claim 1, wherein the dopant polarity of the backgate is the same as the polarity of the MOSFET.

4. The MOSFET according to claim 1, wherein the first semiconductor layer and the second semiconductor layer are made of the same or different materials.

5. The MOSFET according to claim 4, wherein the first semiconductor layer is a SiGe or crystalline Si layer, and the second semiconductor layer is a Si layer.

6. The MOSFET according to claim 1, wherein the first semiconductor layer has a thickness of 10-100 nm, and the first buried insulating layer has a thickness of 20-200 nm.

7. The MOSFET according to claim 1, wherein the second semiconductor layer has a thickness of 5-20 nm, and the second buried insulating layer has a thickness of 5-30 nm.

8. The MOSFET according to claim 1, wherein the first buried insulating layer and the second buried insulating layer are each a buried oxide layer.

* * * * *